US000001824H

United States Statutory Invention Registration [19]

[11] Reg. Number: H1,824

Johnsen et al.

[45] Published: Dec. 7, 1999

[54] VAPOR DEPOSITION OF A THIN POLYMER FILM ON SOLID PROPELLANT ROCKET GRAIN SURFACE

[75] Inventors: Paul T. Johnsen; Alfred O. Smith; Robert B. Dillinger, all of Ridgecrest, Calif.

[73] Assignee: The United States of America as represented by the Secretary of the Navy, Washington, D.C.

[21] Appl. No.: 08/912,969

[22] Filed: Aug. 1, 1997

Related U.S. Application Data

[66] Substitute for application No. 07/743,484, Aug. 8, 1991, abandoned.

[51] Int. Cl.[6] ..... C23C 16/00

[52] U.S. Cl. ..... 427/255.6; 60/253; 102/290

*Primary Examiner*—Harold J. Tudor

*Attorney, Agent, or Firm*—Stephen J. Church; Melvin J. Sliwka

[57] ABSTRACT

A thin film of ignition inhibitor is applied uniformly to a rocket propellant grain which may be large and have a complex shape. The film is applied by condensation and polymerization of a vaporized monomer to which the grain is subjected. The monomer is prepared by thermally cracking the dimer of paraxylylene or a halogenated paraxylylene derivative.

7 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

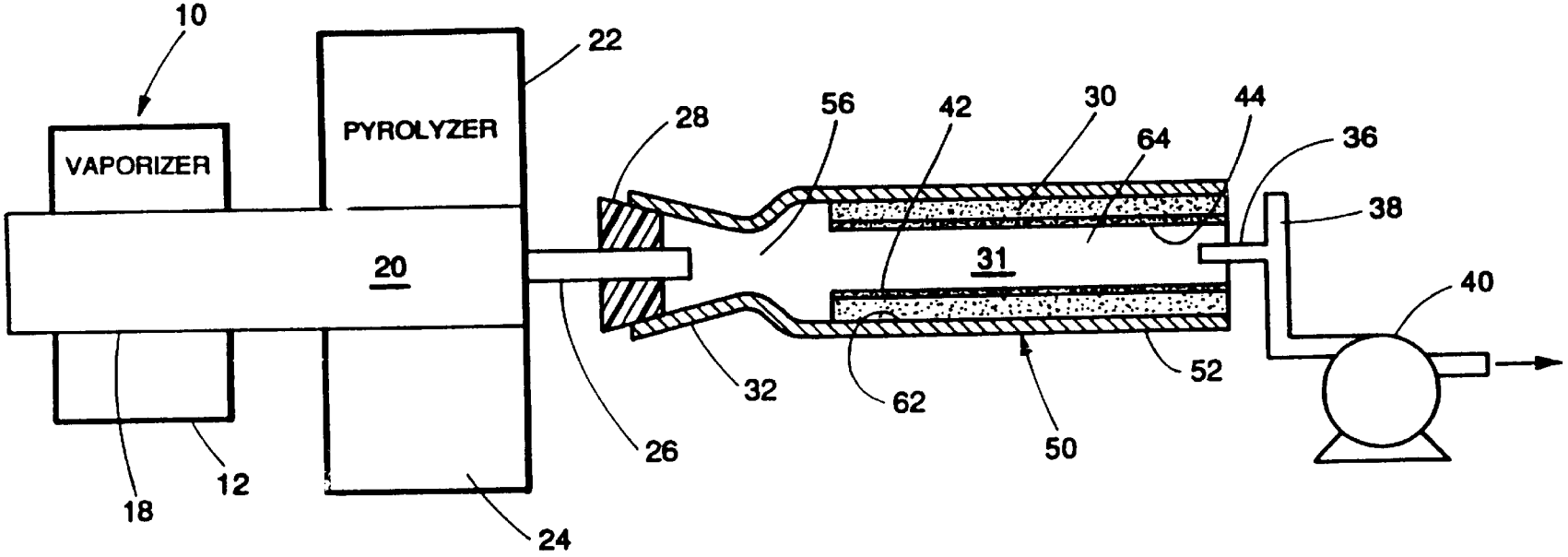
PYROLYZER
VAPORIZER
10
12
18
20
22
24
26
28
30
31
32
36
38
40
42
44
50
52
56
62
64

VAPOR DEPOSITION OF A THIN POLYMER FILM ON SOLID PROPELLANT ROCKET GRAIN SURFACE

CROSS REFERENCE TO RELATED APPLICATION

This application is a substitute for U.S. patent application Ser. No. 07/743,484 which was filed Aug. 8, 1991 and which is now abandoned.

BACKGROUND OF THE INVENTION

1. Field of the Invention

The present invention relates to controlling the ignition rate of a solid propellant rocket grain and, more particularly, this invention relates to the vapor deposition of a thin polymer film on the surface of a rocket grain from a vaporized monomer.

2. Description of the Prior Art

The maximum performance of future missiles is limited by booster rocket and overall system constraints such as the ignition mass flow rise rate. This rate is typically controlled by an inhibitor on the surface of a solid propellant rocket grain.

For the purposes of the present invention, such a grain is defined as a relatively large mass of solid propellant material, which is shaped into a suitable geometric pattern and is used by itself or with only a few other corresponding and relatively large masses, rather than as one particle of a very large number of propellant particles which, for use, may be poured or packed into any suitable container or which are for subsequent incorporation in a binder. A grain of the present invention may be tubular or have a more complex centrally perforated shape or may have the configurations known in the art as cruciform, star, and multitubular.

U.S. Pat. No. 3,523,839, which issued Aug. 11, 1970 to Shechter et al and which is hereby incorporated by reference, describes the application of coatings of paraxylylene polymers to particulate propellant components by condensation thereon of monomers produced by pyrolytic cleavage of the corresponding dimer. However, this patent only discloses the application of such polymers to propellant components which are in particulate form and which are kept in continuous motion in a coating chamber during subjection of the particle exteriors to the monomer.

The general state of technology relating to the inhibition of ignition of a solid propellant rocket grain is either to paint some material on the surface of the grain, or to coat a mandrel with an inhibitor and cast the propellant onto it. The most common method is to paint a liner material on the grain surface. These methods are not uniformly controllable and are labor intensive. The liner material requires a separate cure and it is also very difficult to inspect the liner coating to ascertain whether it is uniformly applied and in the correct thickness. The liner coating formulations contain compounds that can react with and/or migrate into or out of the propellant surface, and thus cause degradation of underlying propellant over time.

It is particularly difficult and expensive to apply a uniformly thick liner coating to shaped or large rocket propellant grains so that the design of rocket motors has been constrained to special configurations to satisfy the limits imposed on the duration of the ignition transient.

BRIEF SUMMARY OF THE INVENTION

The present invention is a method of depositing a thin, uniform film of paraxylylene polymer as an ignition inhibitor on solid propellant rocket grain surfaces which may be large, internal, and of complex shape. The fabricated grain is disposed in a chamber, which may be the casing of a rocket motor incorporating the grain, and subjected to paraxylylene monomer vapors which condense on exposed surfaces of the grain and polymerize on the surfaces to form the film. The monomer is preferably prepared by vaporizing and thermally cracking the corresponding dimer, such as [2.2] paracyclophane or a halogenated derivative thereof.

The present invention thus provides a rocket motor inhibition system deposited in situ from vapor and spontaneously forming a uniform, thin coating on propellant grain surfaces which may be large and/or of complex shape. Due to the uniformity of the coating provided by the invention, the design of rocket motors need not be constrained to satisfy the limits imposed by ignition transients. The invention significantly reduces processing cost by requiring neither the processing of a mandrel for coating nor the labor intensive painting of an inhibitor coating onto an inner surface of a rocket grain and also reduces cost by requiring little labor for clean up.

The inhibition system is inert and does not interact with the propellant or cause migration of plasticizer therein. Also and since the vapor deposited coating of the invention polymerizes as the monomer condenses on the surface, there is no need to cure the coating so there is no plasticizer, curing agent, or unreacted monomer which could react with the propellant. The possibility of grain failure is thus reduced.

The inhibitor coating method of the present invention provides increased reliability in coating thickness by being makers of solid propellant rocket motors.

BRIEF DESCRIPTION OF THE DRAWING

These and many other features and attendant advantages of the invention will become apparent by reference to the following detailed description when considered in conjunction with the accompanying drawing wherein the FIGURE is a schematic view of a coating system for applying an inhibition coating to a solid propellant rocket motor grain by vapor deposition in accordance with the present invention.

DETAILED DESCRIPTION OF THE INVENTION

The vapor-deposition process of the invention utilizes a monomer material that can be vaporized and that then condenses at a moderate temperature below about 300° C. so that the monomer does not affect the solid propellants as it deposits. The vapor-deposited polymer coating is a non-energetic material so that it effectively inhibits the ignition of the propellant grain and does not enhance or contribute to the pressurization of the motor. The deposited polymer has an elongation greater than or equal to the elongation of the underlying solid propellant grain.

The method of the invention can deposit coatings having thicknesses from as low as 100 Angstroms to at least 7 mils. Coatings having thicknesses from 1–50 microns can be utilized as hydrophobic films to keep water off the surface of a propellant grain. However, ignition inhibition requires a thicker coating in the range of about 0.1 to about 7 mils, preferably about 2 mils. If the coating is too thick, the inhibition effect will unduly interfere with ignition and burning of the propellant.

Preferred materials for forming the vapor deposited inhibitor coatings are xylylene monomers. The paraxylylene monomer is a conjugated tetraolefin whose particular arrangement gives it extreme reactivity at its end carbons so as to form a linear paraxylylene polymer homopolymer. These monomers and their production and polymerization are well-known and are described in the above-identified U.S. Pat. No. 3,523,839.

In the present invention, solid propellant substrate at about room temperature is exposed to a controlled atmosphere of gaseous xylylene monomer so that a pin-hole free coating of xylylene polymer forms by vapor deposition polymerization (VDP). The xylylene monomer is thermally stable but kinetically unstable. Although the xylylene monomer is stable as a gas at low pressure, on condensation the monomer spontaneously polymerizes to produce a coating of high molecular weight polyxylylene.

The gaseous p-xylylene monomer (PX) can be generated by ultraviolet light plasma or glow discharges or by pyrolytic cleavage of the dimer. The polymers produced by the excitation of monomer by ultraviolet or electric discharges appear to be less linear, contain more branching and have lower molecular weights so that the preferred source of the reactive monomer is by pyrolytic cleavage of the dimer, di-p-xylylene (DPX).

In contrast to the extreme reactivity of the monomeric PX generated from the dimer DPX, the dimer is an exceptionally stable compound having extremely long shelf life. The diner can have varied substitutions which are known in the literature including the above-identified U.S. Pat. No. 3,523,839. Three commercially available dimers are DPXN, DPXC and DPXD which form polymers known as Parylene N, Parylene C and Parylene D, respectively. The unsubstituted $C_{16}$ hydrocarbon dimer, [2.2] paracyclophane is known as DPXN. Both DPXC and DPXD are prepared from DPXN by aromatic chlorination and differ only in the extent of chlorination. DPXC has an average of one chlorine per aromatic ring and DPXD has an average of 2 chlorines per aromatic ring. There may be more than 2 molecules per monomer of the above halogens. There are materials of similar nature containing other halogens such as fluorine and bromine, and future development could provide better materials for the practice of the present invention by use of these other halogens in combination with chlorine or without chlorine.

The paraxylyene polymers are produced from the dimer in two stages that are physically separate but adjacent. Referring now to the FIGURE, the dimer is placed in a vaporizer 10 which is heated to a temperature of about 150° C. to 200° C. at a pressure of about 100–150 Pa to vaporize the dimer. The vaporizer 10 contains a heating jacket 12 surrounding a tubular member 18 which receives the dimer. The tubular member 18 is connected to a heating chamber 20 of a pyrolyzer unit 22. Chamber 20 is surrounded by a heating furnace 24 which heats the vapor to a temperature from about 300 to about 750° C. at a pressure of from about 30 to about 100 Pa to thermally crack the dimer and thereby produce paraxylylene monomer with free radical ends. The gaseous, active monomer is then fed through an inlet pipe 26 through a plug 28 into a rocket motor chamber 31 containing a representative, solid rocket propellant grain 30. The grain is of centrally perforated, axially open-ended shape which provides an initial burning surface 42 disposed interiorly of the grain.

Plug 28 is received within a thrust nozzle 32 of a representative rocket motor 50 having grain 30 and chamber 31. An outlet tube 36 is connected to a trap 38 and to a vacuum pump 40 which maintains chamber 31 under vacuum of about 1 to 7 Pa. Grain 30 is at a colder temperature, usually at or near room temperature and, typically, from about 20 to 30° C. The active monomer vapors condense on the grain surface 42 to form thereon a thin coating 44 of paraxylylene polymer.

Since the monomer is gaseous and has free access to surface 42 or to any corresponding but more complex rocket propellant grain surface, it is evident that the polymer thickness resulting from condensation of the monomer will be uniform although the grain is stationary during subjection to the monomer.

Motor 50 includes a cylindrical casing 52 having a closed, upper end, not shown, and an open, lower end 56 to which is connected nozzle 32. Grain 30 is, typically, secured to the inside surface of casing 52 by means of adhesive and thermal insulating layers, not shown. When the grain is ignited by an igniter, also not shown, combustion gases create forward propulsion as they exit from the open end of the centrally perforated grain toward and through the nozzle 32.

The solid propellant grain 30 is typically formed from a combustible binder containing a high loading of an oxidizer salt and optional additives such as metal particles, a representative formulation being 10–15% elastomer, such as a cured hydroxyl terminated butadiene polymer (HTPB) or a cured carboxyl terminated butadiene polymer (CTPB), with the remainder being solids such as 60–80% ammonium perchlorate and 10–20% of aluminum powder.

EXAMPLES

In the following examples, cartridge loaded motor grains 2 inches diameter and 6 inches long with a 1 inch diameter center perforation were cast using a typical propellant containing 12% HTPB, 70% ammonium perchlorate, and 18% aluminum. The grains were ignited in a test chamber, and the pressure changes following ignition recorded to determine the ignition rate.

EXAMPLE 1

An uninhibited grain was fired for a baseline of comparison.

EXAMPLE 2

A grain was coated with a 0.0007 inch thick layer of Parylene C (DXPC) was vaporized at 150 to 160° C. and was thermally cracked into the monomer at 690° C.

The ignition time delay due to the inhibiting performance of this coating was 0.079 seconds.

EXAMPLE 3

A grain was coated with a 0.0019 inch thick layer of Parylene C according to the procedure of Example 2.

The ignition time delay from this thicker coating was 1.036 seconds.

In the above examples, comparison of the experimental results and the slopes of the pressure rise between the uninhibited and polyxylylene inhibited grains indicated the control of the ignition of the propellant when coated with a layer of polyxylylene. The deposition of polyxylene onto the initial burning surface of a rocket motor grain thus controls the ignition transient and pressurization of the motor.

The polyxylylene inhibited grains have increased reliability compared to other motor inhibition systems and should lower processing costs by at least 10%. There are decreased opportunities for chemical interactions with the propellant and the pure polyxylylene. Complex and large motor grains can be uniformly and consistently coated with a thin inhibiting film by the method of the invention since, by the very nature of the vapor deposition process, the coating is uniform over the exposed surface regardless of its geometrical complexity. This uniformity is highly advantageous since, in other methods, a complex grain shape causes a non-uniform coating of inhibitor. In the present method, the thickness can be precisely controlled, and witness strips provide a method to gauge the actual thickness of material deposited. Also, the Parylene material will not encourage the migration of any ingredients into or out of the grain.

It is to be realized that only preferred embodiments of the invention have been described and that numerous substitutions, modifications and alterations are permissible without departing from the spirit and scope of the invention as defined in the following claims.

What is claimed is:

1. A method of applying a polymer coating to a surface of a solid propellant rocket grain, the method comprising:

fabricating the grain without the coating;

generating a vaporized monomer that is inert with respect to the grain and that is polymerizable by vapor deposition polymerization; and subjecting the grain to the vaporized monomer, so that the monomer condenses and polymerizes on the surface of the grain to form the coating.

2. The method of claim 1 wherein the coating is an ignition inhibitor and the coating is selected from polymers of paraxylylene and halogenated paraxylenes.

3. The method of claim 1 wherein the monomer is selected from paraxylyene or a halogenated paraxylyene and wherein the method further comprises generating the monomer by thermally cracking a diner corresponding to the selected paraxylyene or halogenated paraxylyene.

4. The method of claim 1 wherein the grain is stationary while subjecting the grain to the vaporized monomer.

5. The method of claim 1 wherein the method further comprises fabricating the grain so that said surface is an interior surface of the grain.

6. The method of claim 1 wherein the method further comprises fabricating the grain within a casing and subsequently subjecting the grain to the vaporized monomer.

7. A method of applying a ignition inhibiting coating to an interior surface of a solid propellant rocket grain, the method comprising:

fabricating the grain with said interior surface and without said coating;

generating a vaporized monomer by thermally cracking a dimer selected from a dimer of paraxylyene or a halogenated paraxylyene; and subjecting the grain to the vaporized monomer, the grain being stationary while being subjected to the vaporized monomer, so that the monomer condenses and polymerizes on said interior surface of the grain to form the coating as a homopolymer of the selected paraxylylene or halogenated paraxylenes.

* * * * *